US008362933B2

(12) United States Patent
Kim et al.

(10) Patent No.: US 8,362,933 B2

(45) Date of Patent: Jan. 29, 2013

(54) TIME-TO-DIGITAL CONVERTER AND OPERATING METHOD

(75) Inventors: Yeomyung Kim, Seoul (KR); Tae Wook Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 102 days.

(21) Appl. No.: 13/083,698

(22) Filed: Apr. 11, 2011

(65) Prior Publication Data

US 2012/0026028 A1 Feb. 2, 2012

(30) Foreign Application Priority Data

Jul. 29, 2010 (KR) ........................ 10-2010-0073380

(51) Int. Cl.
*H03M 1/48* (2006.01)

(52) U.S. Cl. ........................................ 341/111; 341/166

(58) Field of Classification Search .................. 341/111, 341/166, 120, 168, 155; 327/159, 158, 156, 327/244, 285; 375/376
See application file for complete search history.

(56) References Cited

U.S. PATENT DOCUMENTS 7,932,847 B1 * 4/2011 Hsieh et al. ................... 341/155

FOREIGN PATENT DOCUMENTS

| | | | |
|---|---|---|---|
| JP | 7202695 | A | 8/1995 |
| KR | 1020000075411 | A | 12/2000 |
| KR | 10-2004-0033031 | A | 4/2004 |
| KR | 1020080103827 | A | 11/2008 |
| WO | 03/023968 | A3 | 3/2003 |

OTHER PUBLICATIONS

Minjae Lee, "A 9 b, 1.25 ps Resolution Coarse-Fine Time-to-Digital Converter in 90 nm CMOS that Amplifies a Time Residue", IEEE Journal of Solid State Circuits, vol. 43, No. 4, Apr. 2008, pp. 769-777.

* cited by examiner

*Primary Examiner* — Joseph Lauture

(74) *Attorney, Agent, or Firm* — Carter, DeLuca, Farrell & Schmidt LLP

(57) ABSTRACT

Provided are a TDC having a pipeline or cyclic structure and an operating method thereof. The TDC includes a first stage block and a second stage block. The first stage block detects a first bit of a digital code for a time difference between first and second input signals. The second stage block detects a second bit of the digital code for a time difference between first and second output signals of the first stage block. The first stage block amplifies a time difference between first and second delay signals for the first and second input signals to generate the first and second output signals, and transfers the first and second output signals to the second stage block.

15 Claims, 6 Drawing Sheets

TIME-TO-DIGITAL CONVERTER AND OPERATING METHOD

CROSS-REFERENCE TO RELATED APPLICATIONS

This U.S. non-provisional patent application claims priority under 35 U.S.C. §119 of Korean Patent Application No. 10-2010-0073380, filed on Jul. 29, 2010, the entire contents of which are hereby incorporated by reference.

BACKGROUND OF THE INVENTION

The present invention disclosed herein relates to a time-to-digital converter and an operating method thereof, and more particularly, to a time-to-digital converter having a pipeline or cyclic structure and an operating method thereof.

A time-to-digital converter (hereinafter referred to as TDC) is a device that converts time information into a digital code. TDCs generate a digital code corresponding to a time difference between two input signals. The TDCs are widely applied to analog-to-digital converters (ADCs), phase locked loops (PLLs), delay locked loops (DLLs), image sensors, shape scanners and distance measurement equipment.

SUMMARY OF THE INVENTION

The present invention provides a TDC having a pipeline or cyclic structure and an operating method thereof.

Embodiments of the present invention provide a time-to-digital converter (TDC) including: a first stage block detecting a first bit of a digital code for a time difference between first and second input signals; and a second stage block detecting a second bit of the digital code for a time difference between first and second output signals of the first stage block, wherein the first stage block amplifies a time difference between first and second delay signals for the first and second input signals to generate the first and second output signals, and transfers the first and second output signals to the second stage block.

In some embodiments, the first stage block may include: a first fixed delay circuit delaying the first input signal to generate a reference signal; a second fixed delay circuit delaying the reference signal to generate the first delay signal; a bit detector detecting the first bit for the time difference between first and second input signals in response to the reference signal; a variable delay circuit delaying the second input signal to generate the second delay signal, and varying a delay time between the second input signal and the second delay signal according to a value of the first bit; and a time amplifier amplifying the time difference between the first and second delay signals to generate the first and second output signals.

In other embodiments, the time amplifier may amplify the time difference between the first and second delay signals by two times.

In still other embodiments, the first stage block may include a pulse generator generating a pulse signal having a pulse width corresponding to the time difference between the first and second input signals, and the bit detector may determine the value of the first bit according to a level of the pulse signal when the reference signal is shifted.

In even other embodiments, the first bit may be detected as a bit higher than the second bit.

In other embodiments of the present invention, a TDC includes: a bit detector detecting a bit of a digital code for a time difference between first and second signals; a time amplifier amplifying a time difference between first and second delay signals for the first and second signals to generate first and second output signals; and a switch unit selecting first and second input signals inputted from outside as the first and second signals, or selecting the first and second output signals.

In some embodiments, the TDC may further include: a pulse generator generating a pulse signal having a pulse width corresponding to the time difference between the first and second signals; a first fixed delay circuit delaying the first signal to generate a reference signal; a second fixed delay circuit delaying the reference signal to generate the first delay signal; and a variable delay circuit delaying the second signal to generate the second delay signal, and varying a delay time between the second signal and the second delay signal according to a value of the detected bit, wherein the bit detector determines the value of the detected bit according to a level of the pulse signal when the reference signal is shifted.

In other embodiments, the time amplifier may amplify the time difference between the first and second delay signals by two times.

In still other embodiments of the present invention, an operating method of a TDC which converts a time difference between first and second input signals into a digital code includes: detecting a first bit of the digital code for the time difference between the first and second input signals; delaying the first and second input signals to generate first and second delay signals; amplifying a time difference between the first and second delay signals to generate first and second relay signals; and detecting a second bit of the digital code for a time difference between the first and second relay signals.

In some embodiments, in the generating of first and second delay signals, a delay time between the second input signal and the second delay signal may vary according to a value of the first bit.

In other embodiments, in the generating of first and second relay signals, the first and second relay signals may be generated by amplifying the time difference between the first and second delay signals by two times.

In even other embodiments of the present invention, an operating method of a TDC which converts a time difference between first and second input signals into a digital code includes: generating a pulse signal corresponding to a time difference between the first and second input signals; delaying the first input signal to generate a reference signal; detecting a first bit of the digital code from the pulse signal in response to the reference signal; delaying the reference signal to generate a first delay signal; delaying the second input signal to generate a second delay signal; amplifying a time difference between the first and second delay signals to generate first and second relay signals; and detecting a second bit of the digital code for a time difference between the first and second relay signals.

In some embodiments, in detecting of a first bit, a value of the first bit may be determined according to a level of the pulse signal when the reference signal is shifted.

In other embodiments, in the generating of a second delay signal, a delay time between the second input signal and the second delay signal may vary according to a value of the first bit.

In still other embodiments, in the generating of first and second relay signals, the first and second relay signals may be generated by amplifying the time difference between the first and second delay signals by two times.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

A TDC according to embodiments of the present invention has a pipeline or cyclic structure.

Figure 1:
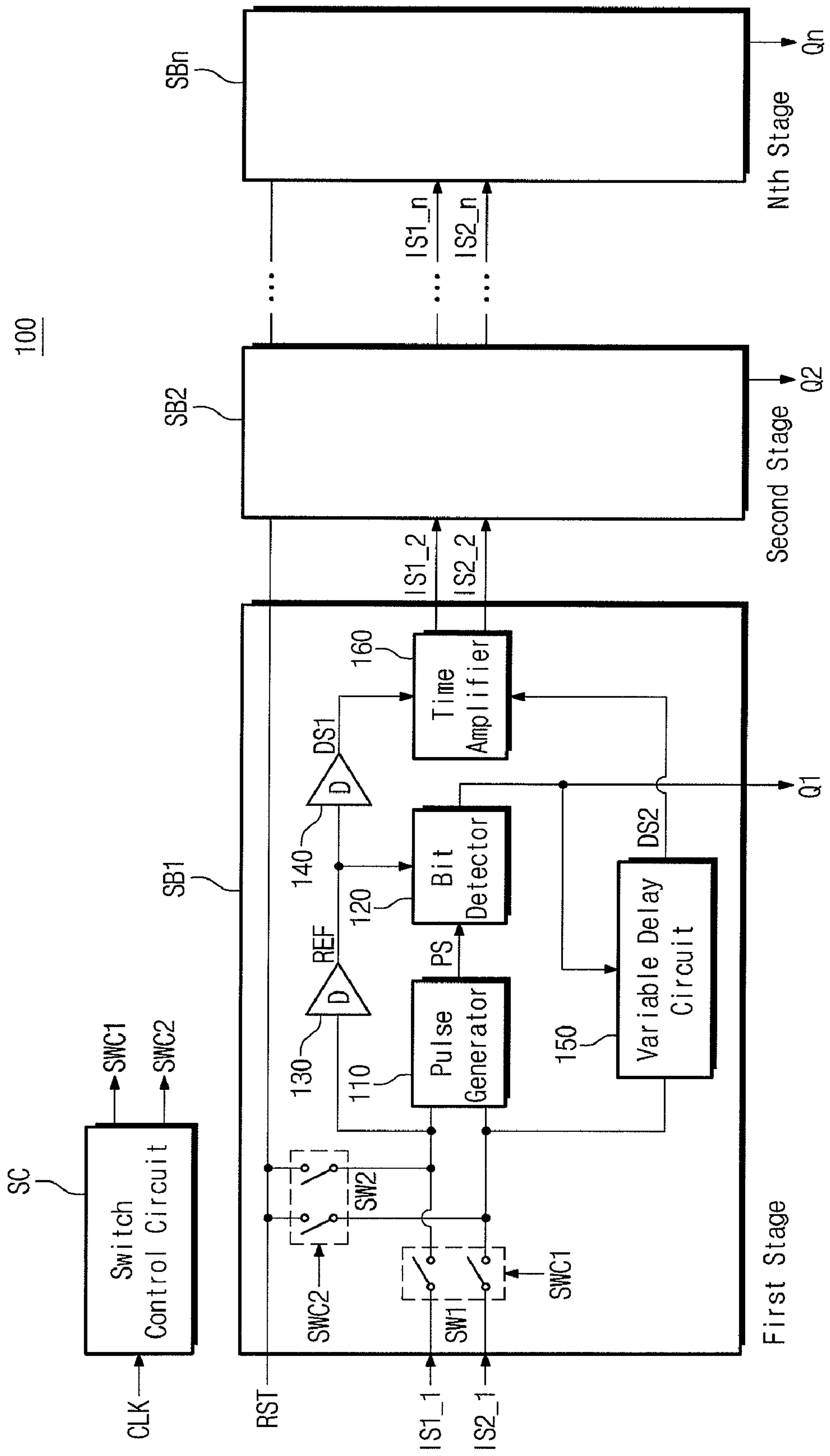
FIG. 1 is a block diagram illustrating a TDC according to an embodiment of the present invention.

FIG. 1 is a block diagram illustrating a TDC according to an embodiment of the present invention.

Referring to FIG. 1, a TDC 100 of pipeline structure is illustrated. The TDC 100 includes a plurality of stage blocks SB1 to SBn, and a switch control circuit SC.

The stage blocks SB1 to SBn output bits Q1 to Qn corresponding to a time difference between first and second input signals IS1_1 and IS2_1 that are inputted from the outside. Herein, the number of output bits corresponds to the number of stage blocks. For example, when it is assumed that the TDC 100 includes first to eighth stage blocks SB1 to SB8, the time difference between the first and second input signals IS1_1 and IS2_1 inputted from the outside are converted into an 8-bit digital code, which is outputted. In this way, as the number of stage blocks included in the TDC 100 increases, the number of output bits increases. The number of output bits increasing denotes that resolution increases in converting of the time difference between the first and second input signals IS1_1 and IS2_1 into the digital code.

The output bit of a previous stage block is outputted as an upper bit compared to the output bit of a next stage block. Therefore, the output bit Q1 of the first stage block SB1 that is first outputted is a most significant bit (MSB), and the output bit Qn of the nth stage block SBn that is last outputted is a least significant bit (LSB).

As an embodiment of the present invention, the second to nth stage blocks SB2 to SBn are configured identically to the first stage block SB1. For conciseness, only the configuration of the first stage block SB1 will be described below. On the other hand, detailed description on configurations of the second to nth stage blocks SB2 to SBn will be omitted.

The first stage block SB1 receives the first and second input signals IS1_1 and IS2_1 from the outside, and the second to nth stage blocks SB2 to SBn receive first and second output signals of the previous stage blocks SB1 to SBn−1 as the first and second input signals IS1_2 to IS1_n and IS2_2 to IS2_n.

The first stage block SB1 includes first and second switches SW1 and SW2, a pulse generator 110, a bit detector 120, first and second fixed delay circuits 130 and 140, a variable delay circuit 150, and a time amplifier 160.

The first switch SW1 is turned on/off in response to a first switch control signal SWC1. The second switch SW2 is turned on/off in response to a second switch control signal SWC2.

While the first switch SW1 is being turned on (or, the second switch SW2 is being turned off) (hereinafter referred to as a first operation section), the first stage block SB1 receives the first and second input signals IS1_1 and IS2_1 to perform a bit detecting operation. While the first switch SW1 is being turned off (or, the second switch SW2 is being turned on) (hereinafter referred to as a second operation section), however, the first stage block SB1 performs a reset operation. That is, in the reset operation, the first and second input signals IS1_1 and IS2_1 are disconnected and a reset signal RST is received.

Operation periods of the first and second switch control signals SWC1 and SWC2 correspond to the operation period of each of the stage blocks SB1 to SBn. As an embodiment of the present invention, a duty ratio of first switch control signal SWC1 to second switch control signal SWC2 is 1:1. That is, when it is assumed that the operation period of each of the stage blocks SB1 to SBn is T, the first and second operation sections may be T/2.

The first operation section determines a maximum time difference between the first and second input signals IS1_1 and IS2_1. For example, when it is assumed that the first input signal IS1_1 is received when the first switch SW1 is turned on and the first switch SW1 is being turned on for 200 ps, the time difference between the first and second input signals IS1_1 and IS2_1 may be converted into a digital code when the second input signal IS2_1 is received in 200 ps from after the first input signal IS1_1 is received.

The pulse generator 110 generates a pulse signal PS in response to the first and second input signals IS1_1 and IS2_1. The pulse generator 110 transfers the pulse signal PS to the bit detector 120. Herein, the pulse width of the pulse signal PS corresponds to the time difference between the first and second input signals IS1_1 and IS2_1. That is, the pulse signal PS is shifted to a high level at a rising edge of the first input signal IS1_1, and is shifted to a low level at a rising edge of the second input signal IS2_1.

The bit detector 120 determines the of the output bit Q1 according to the level of the pulse signal PS in response to a reference signal REF. For example, in a case where the reference signal REF is shifted, the value of the output bit Q1 is 1 when the pulse signal PS has a high level. Herein, the pulse signal PS having a high level denotes that the time difference between the first and second input signals IS1_1 and IS2_1 is greater than a time difference between the first input signal IS1_1 and the reference signal REF.

On the other hand, in a case where the reference signal REF is shifted, the value of the output bit Q1 is 0 when the pulse signal PS has a low level. Herein, the pulse signal PS having a low level denotes that the time difference between the first and second input signals IS1_1 and IS2_1 is less than a time difference between the first input signal IS1_1 and the reference signal REF.

Figure 2:
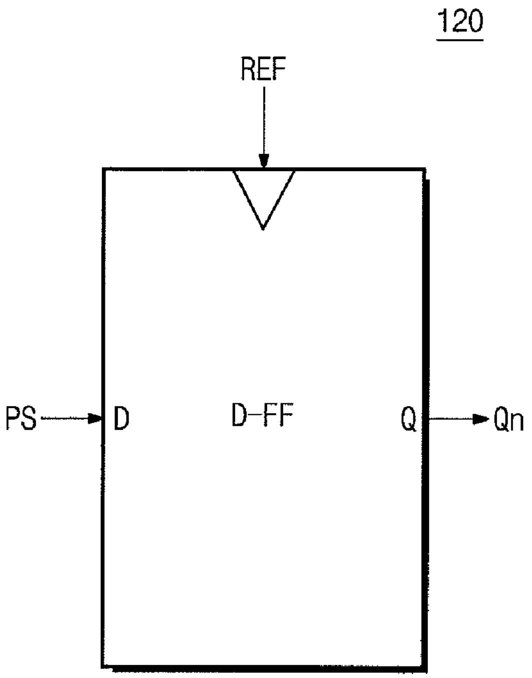
FIG. 2 is a diagram illustrating a bit detector according to an embodiment of the present invention.

FIG. 2 is a diagram illustrating a bit detector according to an embodiment of the present invention.

Referring to FIG. 2, the bit detector 120 may be implemented with a D flip-flop. In this case, the pulse signal PS is an input signal of the D flip-flop, and the reference signal REF is a clock signal of the D flip-flop. However, the bit detector 120 is not limited to the D flip-flop but may be variously implemented.

Referring again to FIG. 1, the first fixed delay circuit 130 delays the first input signal IS1_1 to output the reference signal REF. The second fixed delay circuit 140 delays the reference signal REF to output a first delay signal DS1. Delay times of the first and second fixed delay circuits 130 and 140 will be described below in detail with reference to FIGS. 4 and 5.

The variable delay circuit 150 delays the second input signal IS2_1 to output a second delay signal DS2. At this point, delay time of the variable delay circuit 150 varies according to the output bit Q1. Delay time of the variable delay circuit 150 will be described below in detail with reference to FIGS. 4 and 5.

The time amplifier 160 amplifies a time difference between the first and second delay signals DS1 and DS2. First and second output signals of the time amplifier 160 are transferred as first and second input signals IS1_2 and IS2_2 of the second stage block SB2, respectively. As an embodiment of the present invention, the time amplifier 160 amplifies the time difference between the first and second delay signals DS1 and DS2 by two times.

Figure 3:
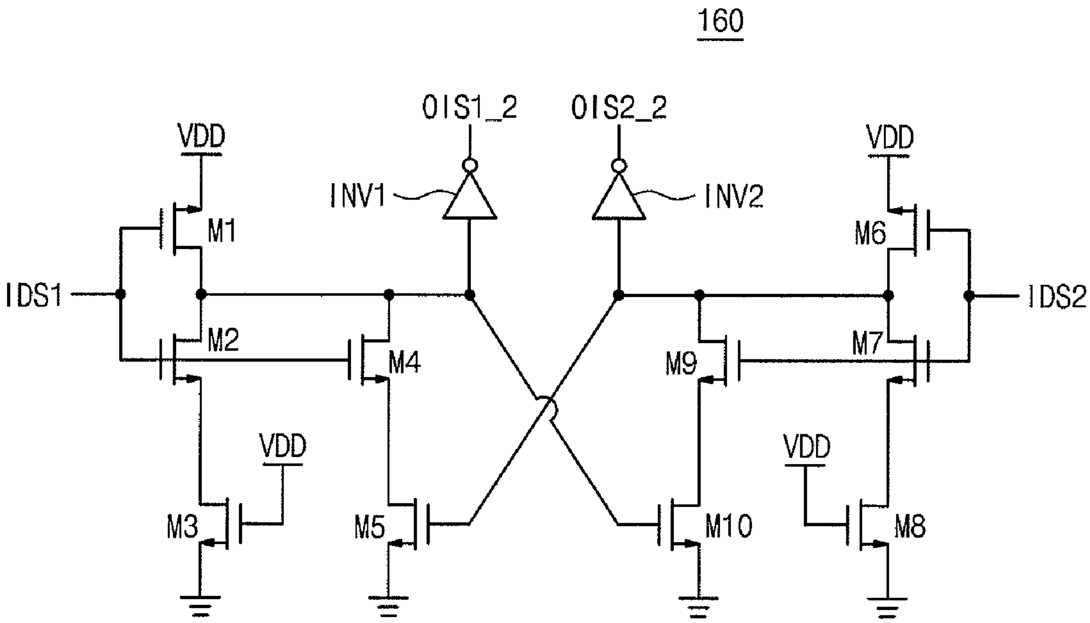
FIG. 3 is a circuit diagram illustrating a time amplifier according to an embodiment of the present invention.

FIG. 3 is a circuit diagram illustrating a time amplifier according to an embodiment of the present invention.

Referring to FIG. 3, the time amplifier 160 includes a plurality of transistors M1 to M10, and first and second inverters INV1 and INV2. The time amplifier 160 has a symmetrical structure.

A first input terminal DS1 is connected to gates of the first, second and fourth transistors M1, M2 and M4. A second input terminal DS2 is connected to gates of the sixth, seventh and ninth transistors M6, M7 and M9. A first output terminal IS1_2 is connected to an output of the first inverter INV1, and a second output terminal IS2_2 is connected to an output of the second inverter INV2.

A driving voltage VDD is connected to drains of the first and sixth transistors M1 and M6. Also, the driving voltage VDD is connected to gates of the third and eighth transistors M3 and M8.

However, the time amplifier 160 is not limited to the circuit of FIG. 3 but may be variously implemented.

Referring again to FIG. 1, the switch control circuit SC receives a clock signal CLK to generate the first and second switch control signals SWC1 and SWC2. Furthermore, the switch control circuit SC provides the first and second switch control signals SWC1 and SWC2 to each of the stage blocks SB1 to SBn.

As an embodiment of the present invention, the switch control circuit SC outputs a signal equal to the clock signal CLK as the first switch control signal SWC1. Furthermore, the switch control circuit SC outputs an inversion signal of the clock signal CLK as the first switch control signal SWC1.

A time interval corresponding to a lower bit is narrower than a time interval corresponding to an upper bit. Therefore, in a TDC having high resolution, very accurate signal control is required for detecting the LSB. However, accurate signal control is limited.

To solve such a limitation, the TDC 100 according to an embodiment of the present invention maintains a constant time interval corresponding to each of the output bits Q1 to Qn in the stage blocks SB1 to SBn by using the delay circuits 130, 140 and 150 and the time amplifier 160. Therefore, even when resolution increases, the TDC 100 can detect an output bit at a constant time interval irrespective of whether a bit of which location is detected. This will be described below in detail with reference to FIGS. 4 and 5.

Figure 4:
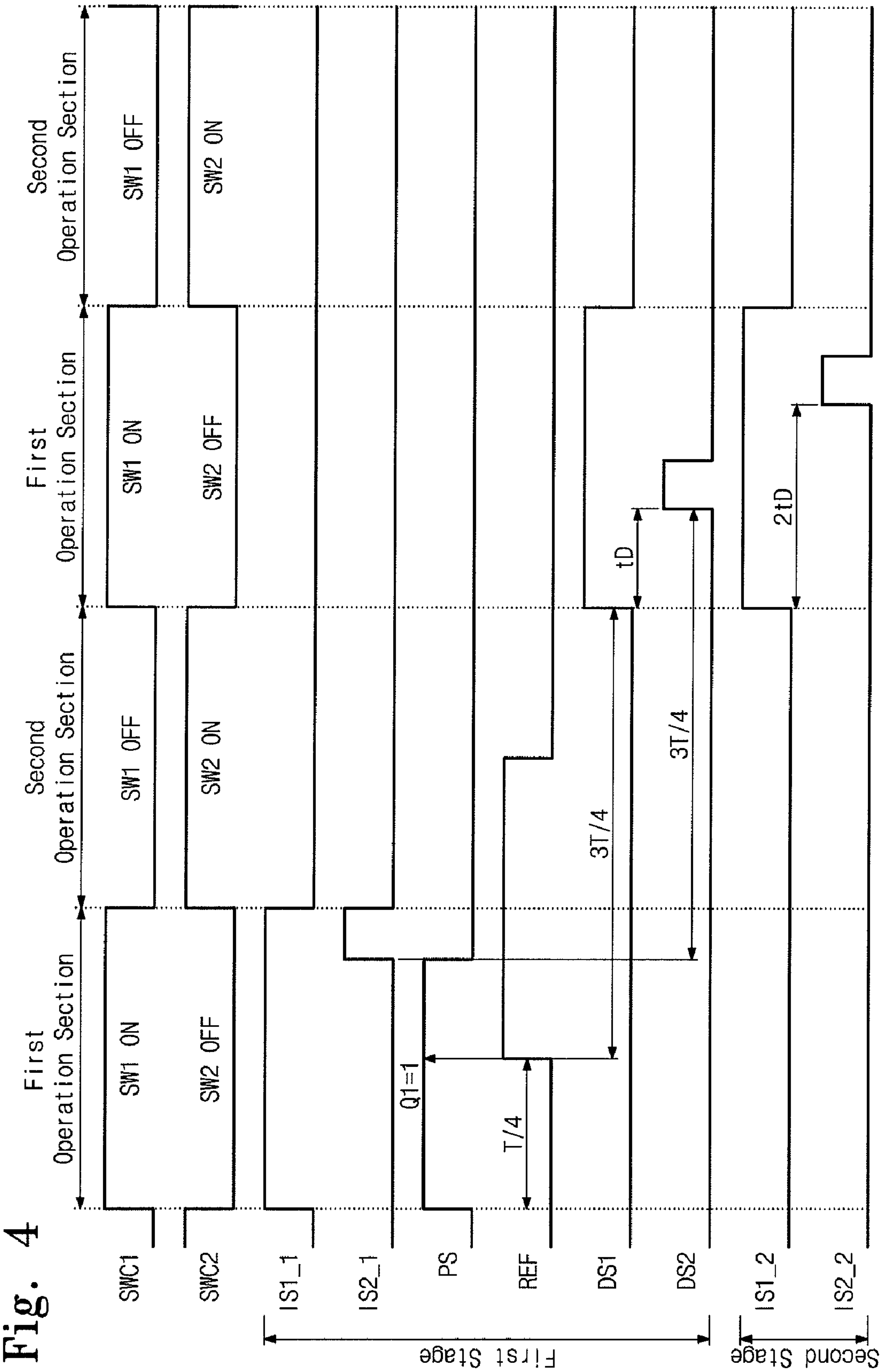
FIGS. 4 and 5 are timing diagrams showing an operating method of a TDC according to an embodiment of the present invention.
Figure 5:
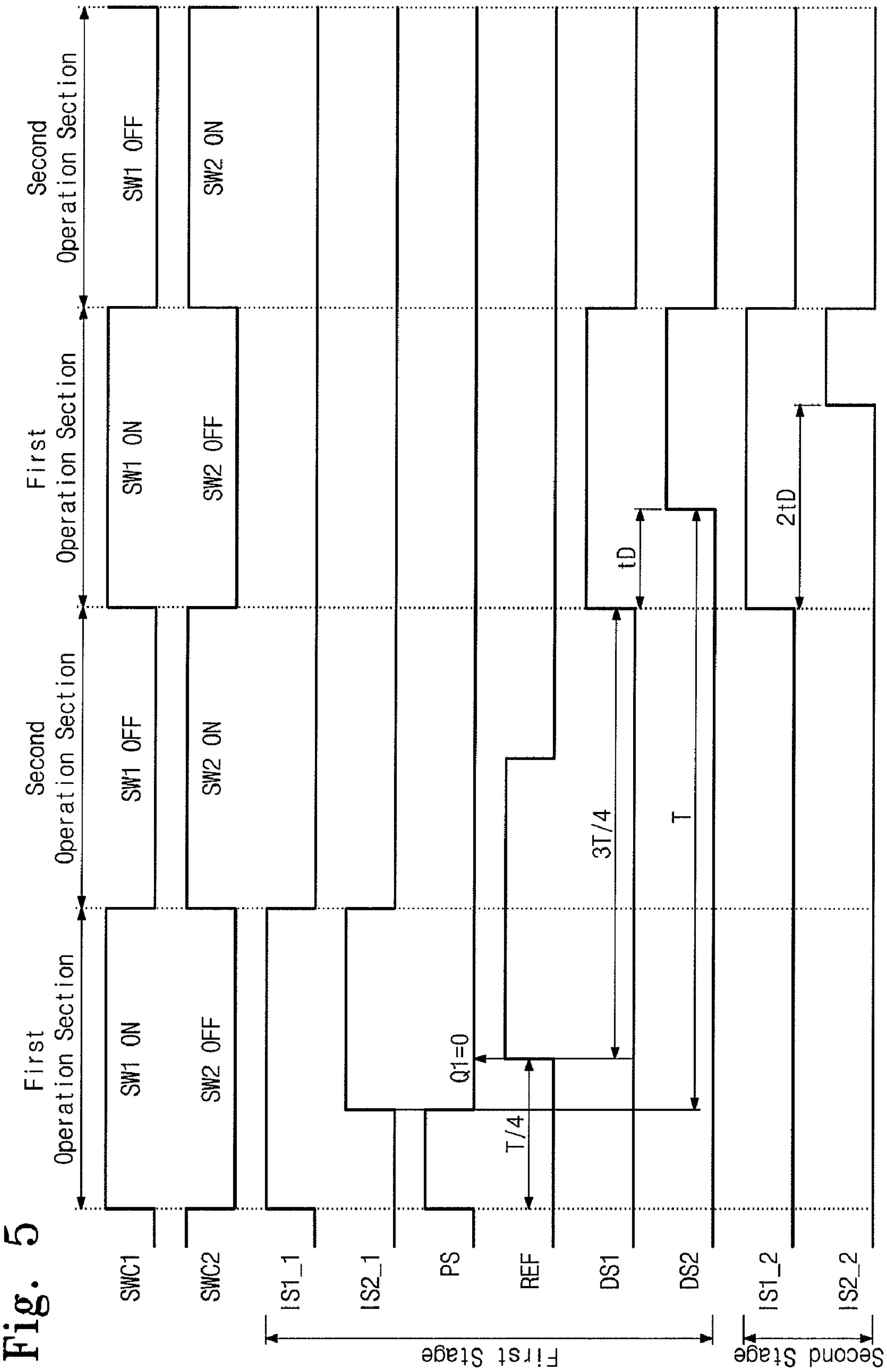

FIGS. 4 and 5 are timing diagrams showing an operating method of a TDC according to an embodiment of the present invention.

In FIG. 4, an operation is shown when the value of the output bit Q1 of the first stage block SB1 is 1. In FIG. 5, an operation is shown when the value of the output bit Q1 of the first stage block SB1 is 0. For conciseness, it is assumed that an operation period of each of the stage blocks SB1 to SBn is T, and time of each of the first and second operation sections is T/2.

Referring to FIGS. 4 and 5, the first and second input signals IS1_1 and IS2_1 are received in the first operation section. Furthermore, the pulse signal PS corresponding to the time difference between the first and second input signals IS1_1 and IS2_1 is generated.

The reference signal REF is a signal where the first input signal IS1_1 has been delayed by T/4. That is, the reference signal REF is shifted at the center of the first operation section. When the reference signal REF is shifted, the value of the output bit Q1 is determined according to level of the pulse signal PS.

As shown in FIG. 4, in a case where the reference signal REF is shifted, the value of the output bit Q1 is determined as 1 when the pulse signal PS has a high level. On the other hand, as shown in FIG. 5, in a case where the reference signal REF is shifted, the value of the output bit Q1 is determined as 0 when the pulse signal PS has a low level.

The first delay signal DS1 is a signal where the reference signal REF has been delayed. In this case, a delay time between the first input signal IS1_1 and the first delay signal DS1 is determined as 3T/4.

The second delay signal DS2 is a signal where the second input signal IS2_1 has been delayed. In this case, a delay time between the second input signal IS2_1 and the second delay signal DS2 varies according to the output bit Q1. As shown in FIG. 4, when the value of the output bit Q1 is 1, the delay time between the second input signal IS2_1 and the second delay signal DS2 is determined as 3T/4. On the other hand, as shown in FIG. 5, when the value of the output bit Q1 is 0, the delay time between the second input signal IS2_1 and the second delay signal DS2 is determined as T.

Subsequently, a time difference between the first and second delay signals DS1 and DS2 is amplified by two times. That is, the time difference between the first and second delay signals DS1 and DS2 is amplified from tD to 2Td. First and second output signals of the time amplifier 160 (see FIG. 1) that are generated by amplifying the time difference between the first and second delay signals DS1 and DS2 by two times are transferred as the first and second input signals IS1_1 and IS2_1 of the second stage block SB2, respectively.

Figure 6:
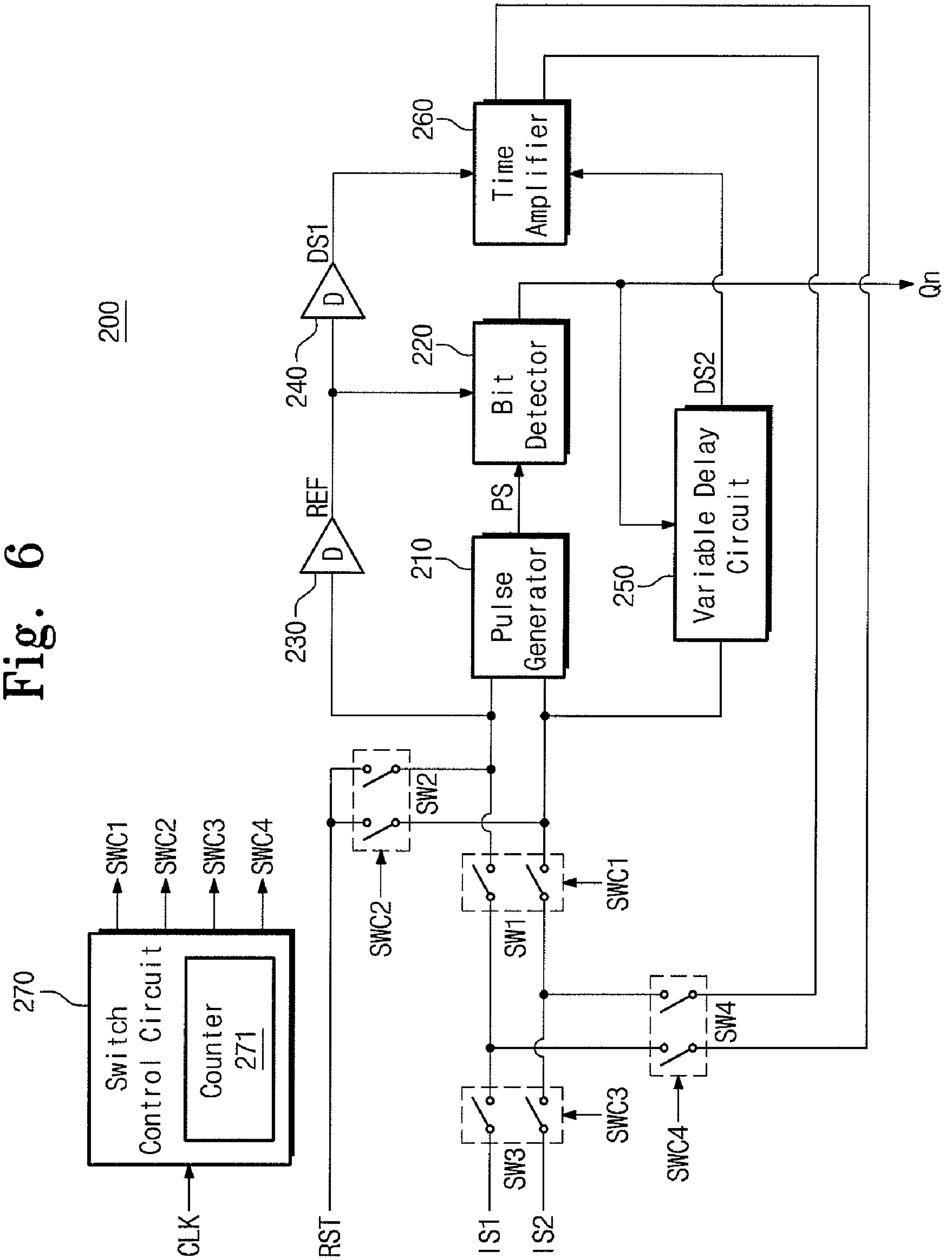
FIG. 6 is a block diagram illustrating a TDC according to another embodiment of the present invention.

FIG. 6 is a block diagram illustrating a TDC according to another embodiment of the present invention.

Referring to FIG. 6, a TDC 200 of cyclic structure is illustrated. The TDC 200 includes first to fourth switches SW1 to SW4, a pulse generator 210, a bit detector 220, first and second fixed delay circuits 230 and 240, a variable delay circuit 250, a time amplifier 260, and a switch control circuit 270.

Hereinafter, repetitive description on the same configuration and operation as those of the TDC 100 in FIG. 1 will be omitted. Description on the first and second switches SW1 and SW2, pulse generator 210, bit detector 220, first and second fixed delay circuits 230 and 240, variable delay circuit 250 and time amplifier 260 will be omitted.

The third switch SW3 is turned on/off in response to a third switch control signal SWC3. The fourth switch SW4 is turned on/off in response to a second switch control signal SWC2.

While the third switch SW3 is being turned on (or, the fourth switch SW4 is being turned off), the TDC 200 is connected to an external input terminal and performs a bit detecting operation on first and second input signals IS1 and IS2. On the other hand, while the third switch SW3 is being turned off (or, the fourth switch SW4 is being turned on), an input terminal of the TDC 200 is connected to an output terminal of the time amplifier 260.

Comparing the TDC 100 of FIG. 1 and the TDC 200 of FIG. 6, while the third switch SW3 is being turned on (or, the fourth switch SW4 is being turned off), the TDC 200 of FIG. 6 operates like the first stage block SB1 of the TDC 100 of FIG. 1. That is, the TDC 200 detects a first output bit Q1 corresponding to a time difference between the first and second input signals IS1 and IS2.

While the third switch SW3 is being turned off (or, the fourth switch SW4 is being turned on), the TDC 200 of FIG. 6 operates through circulation connection (i.e., feedback connection) like the second to nth stage blocks SB2 to SBn of the TDC 100 of FIG. 1. That is, the TDC 200 detects second to nth output bits Q2 to Qn corresponding to the time difference between the first and second input signals IS1 and IS2 at every operation period.

Subsequently, when the third switch SW3 is again turned on (or the fourth switch SW4 is again turned-off), the TDC 200 performs a bit detecting operation on new input signals.

The switch control circuit 270 includes a counter 271. The switch control circuit 270 receives a clock signal CLK to generate the first to fourth switch control signals SWC1 to SWC4. In this case, the switch control circuit 271 generates the third and fourth switch control signals SW3 and SW4 on the basis of a counting value of the counter 271.

The counter 271 performs counting in response to the clock signal CLK. In this case, a maximum counting value of the counter 271 is determined according to resolution (for example, the number of output bits). For example, the TDC 200 repeats the bit detecting operation during four periods for detecting the first to fourth output bits Q1 to Q4 corresponding to the time difference between the first and second input signals IS1 and IS2.

Figure 7:
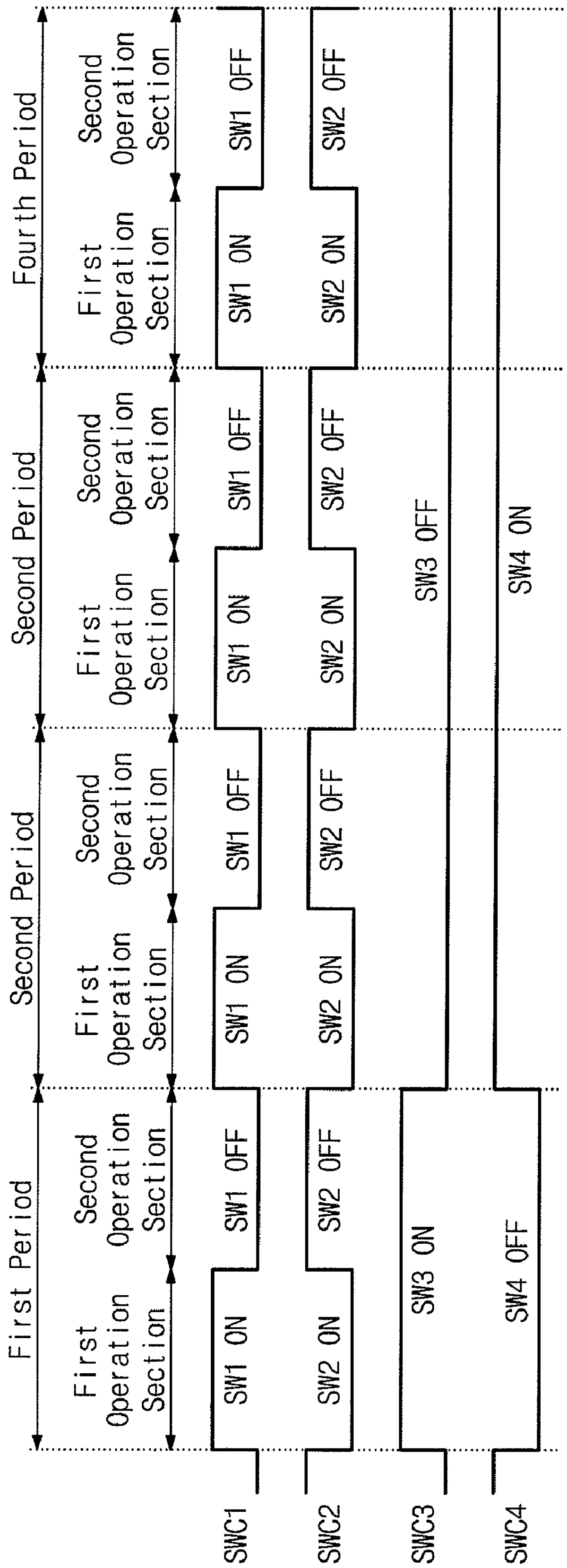
FIG. 7 is a timing diagram showing a switching operation of a TDC according to another embodiment of the present invention.

FIG. 7 is a timing diagram showing a switching operation of a TDC according to another embodiment of the present invention. For conciseness, it is assumed that the TDC 200 repeats the bit detecting operation on the first and second input signals IS1 and IS2 during four periods. That is, it is assumed that the TDC 200 detects the first to fourth output bits Q1 to Q4 corresponding to the time difference between the first and second input signals IS1 and IS2.

Referring to FIG. 7, each operation period includes first and second operation sections. The third switch SW3 is turned on (or the fourth switch SW4 is turned off) for a first period. Subsequently, the third switch SW3 is turned off (or the fourth switch SW4 is turned on) for second to fourth periods.

The TDC and operating method thereof according to the embodiments of the present invention can increase resolution by using the pipeline or cyclic structure.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A time-to-digital converter (TDC) comprising:

a first stage block detecting a first bit of a digital code for a time difference between first and second input signals; and a second stage block detecting a second bit of the digital code for a time difference between first and second output signals of the first stage block, wherein the first stage block amplifies a time difference between first and second delay signals for the first and second input signals to generate the first and second output signals, and transfers the first and second output signals to the second stage block.

2. The TDC of claim 1, wherein the first stage block comprises:

a first fixed delay circuit delaying the first input signal to generate a reference signal;

a second fixed delay circuit delaying the reference signal to generate the first delay signal;

a bit detector detecting the first bit for the time difference between first and second input signals in response to the reference signal;

a variable delay circuit delaying the second input signal to generate the second delay signal, and varying a delay time between the second input signal and the second delay signal according to a value of the first bit; and a time amplifier amplifying the time difference between the first and second delay signals to generate the first and second output signals.

3. The TDC of claim 2, wherein the time amplifier amplifies the time difference between the first and second delay signals by two times.

4. The TDC of claim 2, wherein:

the first stage block comprises a pulse generator generating a pulse signal having a pulse width corresponding to the time difference between the first and second input signals, and the bit detector determines the value of the first bit according to a level of the pulse signal when the reference signal is shifted.

5. The TDC of claim 1, wherein the first bit is detected as a bit higher than the second bit.

6. A time-to-digital converter (TDC) comprising:

a bit detector detecting a bit of a digital code for a time difference between first and second signals;

a time amplifier amplifying a time difference between first and second delay signals for the first and second signals to generate first and second output signals; and a switch unit selecting first and second input signals inputted from outside as the first and second signals, or selecting the first and second output signals.

7. The TDC of claim 6, further comprising:

a pulse generator generating a pulse signal having a pulse width corresponding to the time difference between the first and second signals;

a first fixed delay circuit delaying the first signal to generate a reference signal;

a second fixed delay circuit delaying the reference signal to generate the first delay signal; and a variable delay circuit delaying the second signal to generate the second delay signal, and varying a delay time between the second signal and the second delay signal according to a value of the detected bit, wherein the bit detector determines the value of the detected bit according to a level of the pulse signal when the reference signal is shifted.

8. The TDC of claim 7, wherein the time amplifier amplifies the time difference between the first and second delay signals by two times.

9. An operating method of a time-to-digital converter (TDC) which converts a time difference between first and second input signals into a digital code, the method comprising:

detecting a first bit of the digital code for the time difference between the first and second input signals;

delaying the first and second input signals to generate first and second delay signals;

amplifying a time difference between the first and second delay signals to generate first and second relay signals; and detecting a second bit of the digital code for a time difference between the first and second relay signals.

10. The operating method of claim 9, wherein in the generating of first and second delay signals, a delay time between the second input signal and the second delay signal varies according to a value of the first bit.

11. The operating method of claim 9, wherein in the generating of first and second relay signals, the first and second relay signals are generated by amplifying the time difference between the first and second delay signals by two times.

12. An operating method of a time-to-digital converter (TDC) which converts a time difference between first and second input signals into a digital code, the method comprising:

generating a pulse signal corresponding to a time difference between the first and second input signals;

delaying the first input signal to generate a reference signal;

detecting a first bit of the digital code from the pulse signal in response to the reference signal;

delaying the reference signal to generate a first delay signal;

delaying the second input signal to generate a second delay signal;

amplifying a time difference between the first and second delay signals to generate first and second relay signals; and detecting a second bit of the digital code for a time difference between the first and second relay signals.

13. The operating method of claim 12, wherein in detecting of a first bit, a value of the first bit is determined according to a level of the pulse signal when the reference signal is shifted.

14. The operating method of claim 12, wherein in the generating of a second delay signal, a delay time between the second input signal and the second delay signal varies according to a value of the first bit.

15. The operating method of claim 12, wherein in the generating of first and second relay signals, the first and second relay signals are generated by amplifying the time difference between the first and second delay signals by two times.

* * * * *